US010633763B2

(12) United States Patent
Oh et al.

(10) Patent No.: US 10,633,763 B2
(45) Date of Patent: Apr. 28, 2020

(54) GROWTH OF HIGH QUALITY SINGLE CRYSTALLINE THIN FILMS WITH THE USE OF A TEMPORAL SEED LAYER

(71) Applicant: Rutgers, The State University of New Jersey, New Brunswick, NJ (US)

(72) Inventors: Seongshik Oh, Marlboro, NJ (US); Matthew J. Brahlek, State College, PA (US); Nikesh Koirala, Boston, MA (US); Maryam Salehi, Piscataway, NJ (US)

(73) Assignee: RUTGERS, THE STATE UNIVERSITY OF NEW JERSEY, New Brunswick, NJ (US)

( * ) Notice: Subject to any disclaimer, the term of this patent is extended or adjusted under 35 U.S.C. 154(b) by 259 days.

(21) Appl. No.: 15/819,477

(22) Filed: Nov. 21, 2017

(65) Prior Publication Data

US 2018/0142375 A1 May 24, 2018

Related U.S. Application Data

(60) Provisional application No. 62/424,943, filed on Nov. 21, 2016.

(51) Int. Cl.
*C30B 29/46* (2006.01)
*C30B 23/02* (2006.01)
(Continued)

(52) U.S. Cl.
CPC .......... *C30B 23/025* (2013.01); *C30B 23/063* (2013.01); *C30B 29/46* (2013.01);
(Continued)

(58) Field of Classification Search
CPC ......... C30B 23/63; C30B 23/06; C30B 23/00; C30B 1/00; C30B 29/46
See application file for complete search history.

(56) References Cited

U.S. PATENT DOCUMENTS

| 8,742,253 B1* | 6/2014 | Menezes | H01L 31/0322 136/263 |
| 2012/0073622 A1* | 3/2012 | Yang | C23C 18/1204 136/244 |

(Continued)

OTHER PUBLICATIONS

Kim et al., Growth and Thermoelectric Properties of Multilayer Thin Film of Bismuth Telluride and Indium Selenide via RF Magnetron Sputtering, Journal of Nanoscience and Nanotechnology vol. 12, 3629-3632, 2012.*

*Primary Examiner* — Robert M Kunemund
(74) *Attorney, Agent, or Firm* — Fox Rothschild LLP

(57) ABSTRACT

A method of making high quality insulating single crystalline $In_2Se_3$ films by (1) depositing at least one quintuple layer (QL) of $Bi_2Se_3$ on a substrate layer at a temperature below which only the Se adheres to the substrate; (2) depositing a plurality of $In_2Se_3$ QL's on the deposited $Bi_2Se_3$ layer or layers at a temperature between about 200° C. and about 330° C. to form a hetero-structure; and (3) heating the hetero-structure to a temperature between about 400° C. and about 700° C. so that the $Bi_2Se_3$ layer is diffused through the $In_2Se_3$ layer and evaporated away.

10 Claims, 2 Drawing Sheets

(51) Int. Cl.
*H01L 21/02* (2006.01)
*H01L 29/24* (2006.01)
*C30B 23/06* (2006.01)

(52) U.S. Cl.
CPC .... *H01L 21/0242* (2013.01); *H01L 21/02433* (2013.01); *H01L 21/02485* (2013.01); *H01L 21/02505* (2013.01); *H01L 21/02568* (2013.01); *H01L 21/02598* (2013.01); *H01L 21/02631* (2013.01); *H01L 21/02664* (2013.01); *H01L 29/24* (2013.01)

(56) References Cited

U.S. PATENT DOCUMENTS

| | | | |
|---|---|---|---|
| 2012/0094431 A1* | 4/2012 | Curtis | C23C 18/1204 438/102 |
| 2013/0217214 A1* | 8/2013 | Munteanu | H01L 21/02557 438/479 |

* cited by examiner

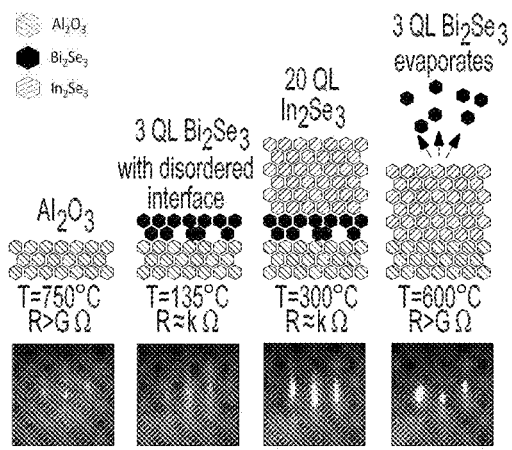
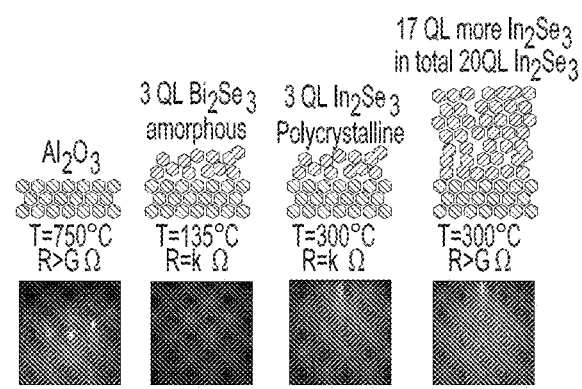
FIG. 1a  FIG. 1b
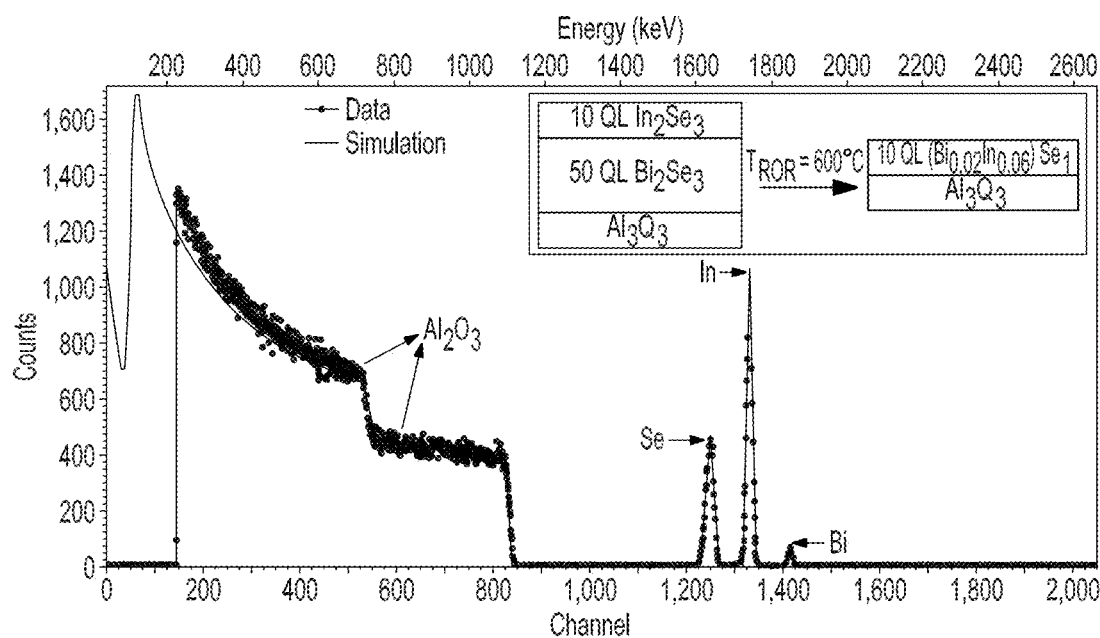
FIG. 2

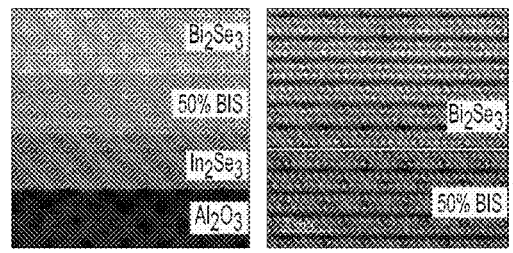
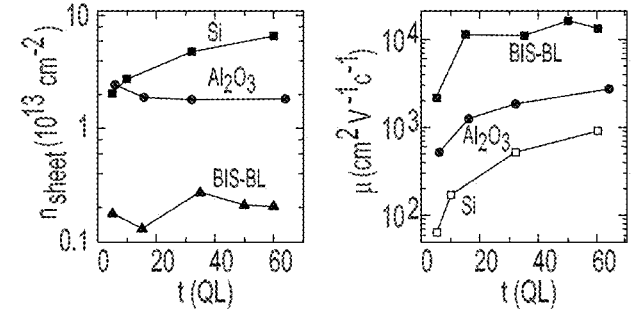
FIG. 3a  FIG. 3b
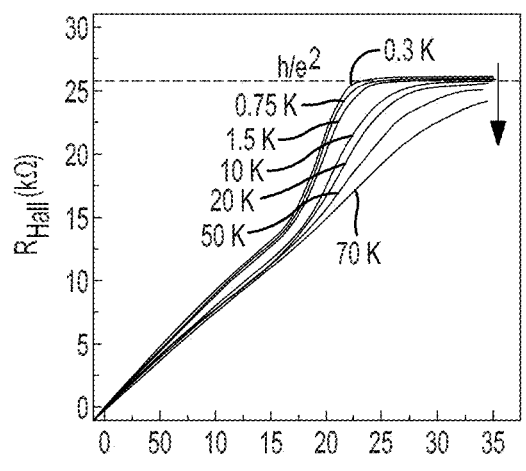
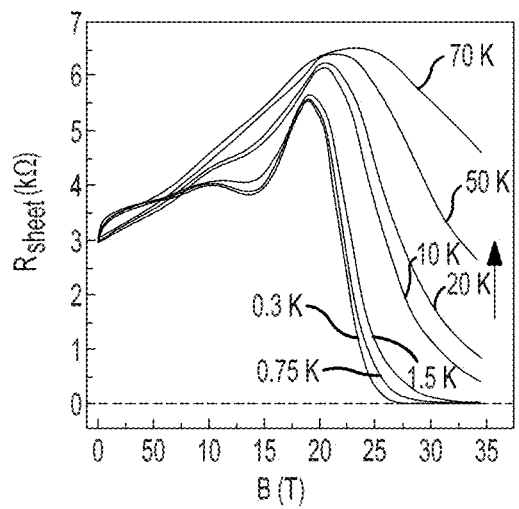
FIG. 4a  FIG. 4b

GROWTH OF HIGH QUALITY SINGLE CRYSTALLINE THIN FILMS WITH THE USE OF A TEMPORAL SEED LAYER

CROSS-REFERENCE TO RELATED APPLICATIONS

This patent document claims priority under 35 U.S.C. § 119(e) to the U.S. Provisional Patent Application No. 62/424,943, filed Nov. 21, 2016. This Provisional U.S. Application is incorporated herein by reference in its entirety.

FIELD OF THE INVENTION

This disclosure relates to the field of molecular beam epitaxy (MBE) growth techniques and thin film fabrication of IIIA/VIA and VA/VIA compounds.

BACKGROUND OF THE INVENTION

It is known that indium selenide ($In_2Se_3$) possesses at least five different phases α, β, γ, δ, and κ with a (hexagonal layered structure with 1.3 eV band gap) and γ (defective wurtzite structure with 2 eV band gap) being the most stable phases at room temperature. $In_2Se_3$ offers promise in applications for optoelectronic devices, non-volatile phase change memory, and energy storage. Further, due to its similar crystal structure and small lattice mismatch, $In_2Se_3$ is a compatible template for growth of prototypical 3D topological insulator (TI) $Bi_2Se_3$. This holds great importance since interfacial and bulk defects have remained a major obstacle for further progress in the field of TIs since their discovery; and thus, having a chemically inert substrate with a small lattice mismatch is a key step toward suppressing these defects and eventually realization of functional TI devices for application in quantum computation and spintronics.

However, a reliable way to grow high quality single crystalline $In_2Se_3$, essential for esoteric fundamental physics studies as well as future technology, is still missing. This is because $In_2Se_3$ grows in a polymorphic fashion on current commercially available substrates, such as sapphire ($Al_2O_3$) and strontium titanate ($SrTiO_3$). Even in the attempt by Rathi et al. "Optimization of $In_2Se_3$/Si(111) Heteroepitaxy To Enable $Bi_2Se_3$/$In_2Se_3$ Bilayer Growth" *Cryst. Growth Des.* 14, 4617-4623 (2014), the MBE growth of $In_2Se_3$ on H-passivated Si(111), which has a lower lattice mismatch, led to a disordered interface.

SUMMARY OF THE INVENTION

It has now been discovered that similar to the case of $In_2Se_3$, which is a proper template for $Bi_2Se_3$, $Bi_2Se_3$ can serve as an efficient template for $In_2Se_3$ growth. Exploiting this idea along with growth engineering techniques resulted in the growth of single crystalline $In_2Se_3$ with the highest so far reported quality.

With the use a temporal seed of $Bi_2Se_3$, an insulating buffer layer of $In_2Se_3$ with high crystal quality is grown, which, in turn, due to similar structure, acts as an efficient template for growth of low-defect-density $Bi_2Se_3$, an archetypical 3D topological insulator (TI), with record high mobility. The temporal seed of $Bi_2Se_3$ initially acts as a growth template for the $In_2Se_3$ layer and then evaporates and diffuses out of $In_2Se_3$ layer upon heating to higher temperature leaving behind only single crystal insulating $In_2Se_3$ layer. This virtually-grown high-quality substrate is an efficient template not only for the $Bi_2Se_3$ layer, but for the entire range of $(Bi_{1-x}In_x)_2Se_3$ (0≤x≤1) solid solution.

Therefore, according to one aspect of the invention, a method of making an insulating single crystalline $In_2Se_3$ layer is provided, in which at least one quintuple layer (QL) of $Bi_2Se_3$ is deposited on a substrate layer at a temperature below which only the Se adheres to the substrate. A plurality of $In_2Se_3$ QL's are then deposited on the $Bi_2Se_3$ layer or layers at a temperature between about 200° C. and about 330° C. to form a hetero-structure. The hetero-structure is then heated to a temperature between about 400° C. and about 700° C., so that the $Bi_2Se_3$ layer is diffused through the $In_2Se_3$ layer and evaporated away.

In one embodiment, the $Bi_2Se_3$ is deposited at a temperature between about 110° C. and about 200° C. In another embodiment the hetero-structure is heated to about 600° C. so that the $Bi_2Se_3$ layer is diffused through the $In_2Se_3$ layer and evaporated away.

In one embodiment, the substrate is single crystal $Al_2O_3$ or a high κ-dielectric $SrTiO_3$ (111). In another embodiment, a plurality of $Bi_2Se_3$ QL's are deposited on the substrate. In yet another embodiment, at least one QL of $BiInSe_3$ is deposited on the $In_2Se_3$, before the $Bi_2Se_3$ is deposited on the $BiInSe_3$ layer at a temperature below which only the Se adheres to the $BiInSe_3$ layer.

Stoichiometrically equal quantities of Bi and In in the BiInSe need not be employed. In one embodiment, at least one QL of $Bi_2Se_3$ is deposited on said $In_2Se_3$ layer at a temperature between about 200° C. and about 300° C. In one embodiment, the $Bi_2Se_3$ layer and the $BiInSe_3$ layer are deposited at a temperature between about 200° C. and about 300° C.

In one embodiment, a capping layer $MoO_3$ is deposited on said $Bi_2Se_3$ layer. In another embodiment, an Se layer is deposited on top of the $MoO_3$ layer.

In another aspect of the present invention, an essentially pure single crystal layer of $In_2Se$ on a substrate is provided, prepared by the method of the present invention. In one embodiment, the substrate is single crystal $Al_2O_3$ or a high κ-dielectric $SrTiO_3$ (111).

In one embodiment, a layer of $Bi_2Se_3$ is provided on top of said $In_2Se_3$ layer, wherein said $Bi_2Se_3$ layer has a lattice mismatching less than about 1.5%. In yet another embodiment, a layer of $BiInSe_3$ is provided between the $In_2Se_3$ layer and the $Bi_2Se_3$ layer.

In another aspect of the present invention, an essentially pure single crystal layer of $In_2Se_3$ on a substrate is provided. In one embodiment, a layer of $Bi_2Se_3$ is provided on top of said $In_2Se_3$ layer, wherein said $Bi_2Se_3$ layer has a lattice mismatching less than about 1.5%. In one embodiment, a layer of $BiInSe_3$ is provided between said $In_2Se_3$ layer and said $Bi_2Se_3$ layer. In one embodiment, the substrate is single crystal $Al_2O_3$ or a high κ-dielectric $SrTiO_3$ (111).

BRIEF DESCRIPTION OF DRAWINGS

FIG. 1*a* illustrates the growth process of $In_2Se_3$ on $Bi_2Se_3$ temporal layer with corresponding reflected high-energy electron diffraction (RHEED) at each stage (Adapted from *Nano Lett.*, 15, 8245-8249, 2015). FIG. 1*b* in comparison, illustrates the growth of $In_2Se_3$ directly on a sapphire substrate which is an indication of lower quality growth.

FIG. 2 shows the Rutherford backscattering spectroscopy (RBS) data and its related fit on a 50 QL $Bi_2Se_3$ on 10 QL $In_2Se_3$ heterostructure after annealing to 600° C. (Adapted from *Nano Lett.*, 15, 8245-8249, 2015).

FIG. 3a illustrates the transmission electron microscopy (TEM) of the buffer layer which shows the sharp interfaces at each layer. FIG. 3b is a comparison of sheet carrier densities (left panel) and Hall mobilities (right panel) of $Bi_2Se_3$ films grown on BIS-BL, $Al_2O_3(0001)$ and Si(111) for various film thicknesses (Adapted from *Nano Lett.*, 15, 8245-8249, 2015).

FIG. 4a shows the Hall effect ($R_{Hall}$) as a function of magnetic field at various temperatures for an 8 QL thick Bi2Se3 film grown on the buffer layer; and FIG. 4b shows the longitudinal sheet resistance ($R_{sheet}$) as a function of magnetic field at various temperatures for an 8 QL thick Bi2Se3 film grown on the buffer layer.

DETAILED DESCRIPTION OF THE INVENTION

The novel growth methodology of high-quality crystalline $In_2Se_3$ thin film and the role of the same as an efficient buffer layer for TI $Bi_2Se_3$ is described in this disclosure. This invention provides a growth procedure of single crystalline $In_2Se_3$ using a temporal seed of $Bi_2Se_3$ which can be used for various applications. Moreover, this $In_2Se_3$ is an excellent growth template for the entire range of $(Bi_{1-x}In_x)_2Se_3$ (0≤x≤1) solid solution. More importantly, the growth of $Bi_2Se_3$ on top of $In_2Se_3/BiInSe_3$ buffer layer resulted in defect-suppressed TI films of $Bi_2Se_3$ with record low carrier density and high mobility which eventually revealed novel aspects, such as topological surface states (TSS)-originated quantum Hall effect and quantized Faraday and Kerr rotation which heretofore were unobservable in conventionally grown $Bi_2Se_3$.

The heart of this invention is the temporal seed of $Bi_2Se_3$ that initially acts as a template for the $In_2Se_3$ layer with any desired thickness, and then it evaporates away and diffuses out of $In_2Se_3$ layer upon heating, leaving behind only an insulating $In_2Se_3$ layer with high crystallinity. It is worth noting that this growth methodology is not limited to molecular beam epitaxy (MBE) systems and can be replaced by other growth techniques such as chemical vapor deposition, which is mainly used for industrial applications. Furthermore, this new growth scheme and this highly crystalline buffer layer can be further extended to the growth of other TI systems, which in turn enhance TI performance and applicability for the purpose of spintronics and quantum computers.

The method of the present invention includes the following steps:

A single crystal commercially available substrate is prepared. For example, an $Al_2O_3$ (0001) substrate is cleaned ex situ by five minutes exposure to UV-generated ozone and in situ by heating to 750° C. in an oxygen pressure of $1\times10^{-6}$ Torr for ten minutes.

99.999% Pure elemental bismuth, indium, and selenium sources are provided for film growth. For example, the sources are thermally evaporated using Knudsen cells. As a guide, source fluxes were calibrated in situ by quartz crystal micro-balance (QCM) and ex situ by Rutherford backscattering spectroscopy (RBS). The ratio of selenium flux to bismuth/indium flux was maintained at above 10:1 as determined by QCM.

Quintuple layers (QL, where 1 QL is made of 5 successive layers of Se—Bi—Se—Bi—Se and is roughly 1 nm thick) of $Bi_2Se_3$ are deposited at a temperature at which the atoms will adhere to the substrate, typically between about 110 and about 200° C. to serves as a template for the $In_2Se_3$ layer. According to one embodiment, temperature of 135° C. is employed.

The number of QL is not critical. The $Bi_2Se_3$ layer can be as thin as 1 QL or unlimited in number and thickness. For optimum results in terms of the quality of the $In_2Se_3$ layer grown thereon, at least a 3 QL seed layer is used.

The thickness of $In_2Se_3$ deposited on the $Bi_2Se_3$ layer can be anything beyond 1 QL. For example, 20 QL $In_2Se_3$ is deposited on the $Bi_2Se_3$ layer at a temperature between about 200° C. and about 330° C. In one embodiment, $In_2Se_3$ is deposited on the $Bi_2Se_3$ layer at a temperature or about 300° C. The 20 QL can be replaced by any other desired thickness. At this point, a hetero-structure is provided consisting of $Bi_2Se_3$ and $In_2Se_3$.

Because of the lower evaporation point of $Bi_2Se_3$, heating the entire hetero-structure to between about 400° C. and about 700° C. makes the $Bi_2Se_3$ seed layer diffuse through the $In_2Se_3$ layer and evaporate away, at which point only the QLs of insulating $In_2Se_3$ remain. In one embodiment the hetero-structure is heated to about 600° C.

The $In_2Se_3$ layer is an essentially pure single crystal layer. The single $In_2Se_3$ crystal layer has a purity greater than 99.999%.

Next, a $Bi_2Se_3$ layer is deposited in the single crystal $In_2Se_3$ layer. In one embodiment, solid solution $BiInSe_3$ of any desired QL thickness is deposited at a temperature between about 200° C. and about 300° C., followed by deposition of $Bi_2Se_3$ within the same temperature range. In one embodiment, both the $BiInSe_3$ and the $Bi_2Se_3$ layers are deposited at a temperature of about 275° C. The combination of single crystalline $In_2Se_3$ and $BiInSe_3$ in the insulating buffer layer (BIS-BL) works as an excellent template for $Bi_2Se_3$ growth.

The $BiInSe_3$ layer minimizes the In diffusion into the top $Bi_2Se_3$ layer. Moreover, this layer minimizes the lattice mismatching below 1.5%, in comparison to 3%, 14% and 8% lattice mismatch for $In_2Se_3$, $Al_2O_3$, and Si substrates, respectively, resulting in higher quality growth of $Bi_2Se_3$.

In addition to $Bi_2Se_3$, the present invention can also be employed to fabricate thin films of $Bi_2Te_3$ and $Sb_2Te_3$.

Essentially any suitable substrate can be used; however, film quality will vary depending on the substrate employed. In addition to $Al_2O_3$ substrates, for example, a high κ-dielectric $SrTiO_3$ (111) substrate can be employed, which is useful for applying back gate voltage.

$SrTiO_3$ (STO) substrates are prepared by five minutes ex situ cleaning with ozone, after which the substrate is heated in situ to about 650° C. and cooled to about 150° C. in an oxygen pressure of $1\times10^{-6}$ Torr. The oxygen helps with further cleaning of the substrate, and concurrently it prevents oxygen deficiencies in STO, thereby maintaining the insulating properties.

For STO substrates, the initial QLs of $Bi_2Se_3$ are deposited at higher temperatures, about 150° C., for example, after which the film is heated to 300° C. for further deposition of $Bi_2Se_3$. Thicker films ensure better templates and minimize disorders because $Bi_2Se_3$ growth on STO substrates is not as good as on $Al_2O_3$ substrate.

For STO substrates, thin $In_2Se_3$ (6 QL in one embodiment) is deposited afterward, and the whole hetero-structure is heated to evaporate the underlying $Bi_2Se_3$ layer (about 600° C. in one embodiment). This is followed by deposition of a thin layer of solid solution $BiInSe_3$ (3 QL in one embodiment) at about 275° C. in one embodiment.

A top layer of $Bi_2Se_3$ with any desired thickness is deposited for further study and transport measurements. It is better to maintain this layer as thin as possible for more effective gating. The purpose of thin $In_2Se_3$ is to minimize the separation between STO and $Bi_2Se_3$ and to maximize the effect of back gating on the $Bi_2Se_3$ layer.

Finally, for any substrate, a capping layer of electron-depleting molybdenum oxide ($MoO_3$) as well as a selenium (Se) layer are deposited in situ on the film. The layers lower the Fermi level and decrease carrier density even further. They also protect the thin film against aging in air.

The figures relate to certain embodiments of the invention, in which FIG. 1a confirms the high-quality 2-dimensional growth of $In_2Se_3$ on temporal seeds of $Bi_2Se_3$. In FIG. 1b, the growth of $In_2Se_3$ directly on a sapphire substrate is depicted, which is not 2-dimensional, and the streaks are rather elongated compared to $In_2Se_3$ growth on $Bi_2Se_3$. Further, upon rotating the growth stage, the pattern does not rotate or change in a continuous fashion and instead is static indicating that the surface is not atomically flat and it has in-plane randomness. This is due to the polymorphic growth of $In_2Se_3$ on a sapphire substrate. The same thing happens if $In_2Se_3$ is grown directly on other commercially available substrates, such as Si and STO.

In FIG. 2, RBS fit to the data gives ~10 QL thick $(Bi_{0.02}In_{0.98})_2Se_3$ indicating $Bi_2Se_3$ evaporates away almost completely after annealing the hetero structure to 600° C. The inset is the cartoon of the film before and after the 600° C. annealing process. The 50 QL thick $Bi_2Se_3$ is only grown for RBS purpose to demonstrate that even thick $Bi_2Se_3$ almost completely evaporates away. In other words, the small amount of Bi remained for thick $Bi_2Se_3$ deposition in FIG. 2 becomes completely negligible for the much thinner 3QL $Bi_2Se_3$ that is used as a template.

The TEM image in the left panel of FIG. 3a shows sharp interfaces between $Al_2O_3/In_2Se_3$, $In_2Se_3/BiInSe_3$, and $BiInSe_3/Bi_2Se_3$ layers and the right panel specifically shows the $BiInSe_3/Bi_2Se_3$ interface clearer. This is an indication of high-quality van der Waals growth at all interfaces which led to a high quality single crystalline $In_2Se_3$ layer and eventually low defect density TI thin films with high mobility. In contrast, TEM images for the interface of $In_2Se_3$ grown on any commercial substrate is quite hazy which indicates disordered growth. The FIG. 3b left panel compares the sheet carrier density $n_{sheet} \approx 1\text{-}3 \times 10^{12}$ cm$^{-2}$ for the entire thickness range of 5 to 60 QL $Bi_2Se_3$ grown on BIS-BL with films grown on $Al_2O_3(0001)$ and Si(111) that exhibit an order of magnitude larger values of $n_{sheet}$ due to significantly larger defect densities. The right panel of FIG. 3b shows that the mobility of ~16,000 cm$^{-2}$V$^{-1}$s$^{-1}$ $Bi_2Se_3$ grown on BIS-BL is about an order of magnitude larger than the mobility of films grown on $Al_2O_3(0001)$ and Si(111), and this directly shows that BIS-BL substantially suppresses the net defect density.

FIG. 4 depicts the role the atomic-scale virtual substrate $In_2Se_3$ plays in suppressing the interfacial defects in topological insulator $Bi_2Se_3$. This led to observation of the quantum Hall effect (QHE) originated from TSS for the first time in this pure binary compound. FIGS. 4a and 4b show the Hall effect ($R_{Hall}$) and the longitudinal sheet resistance ($R_{sheet}$), respectively, as a function of magnetic field at various temperatures for an 8 QL thick $Bi_2Se_3$ film grown on the buffer layer. The data for 0.3 K shows that $R_{sheet}$ vanishes (0.0±0.5Ω) above 31 T indicating dissipation-less transport, with simultaneous perfect quantization of $R_{Hall}$= (1.00000±0.00004)h/e$^2$ (25813±1Ω) above 28 T. As shown in FIGS. 4a and 4b, at the maximum field the quantum Hall plateau vanishes between 20 and 50 K, but the signature of QHE persists even up to 70 K.

Certain embodiments of the invention are depicted by following Examples:

EXAMPLES

I. Methods:

Films were grown on 10 mm×10 mm $Al_2O_3(0001)$ substrates using custom-built SVTA MOS-V-2 MBE system with a base pressure of $2\times10^{-10}$ Torr. Substrates were cleaned ex situ by five minutes exposure to UV-generated ozone and in situ by heating to 750° C. in an oxygen pressure of $1\times10^{-6}$ Torr for ten minutes. 99.999% pure elemental bismuth, indium and selenium sources were thermally evaporated using Knudsen cells for film growth. Source fluxes were calibrated in situ by quartz crystal micro-balance (QCM) and ex situ by Rutherford backscattering spectroscopy. The ratio of selenium flux to combined bismuth and indium flux was maintained at above 10:1 as determined by QCM. For 20 QL $(Bi_{0.5}In_{0.5})_2Se_3$ growth, bismuth and indium were co-evaporated by opening both shutters simultaneously, while the selenium shutter was kept open at all times during growth. For capped films, Se and $MoO_3$ were thermally evaporated at room temperature for capping.

Films were transferred from the growth chamber to an ex situ cryostat for transport measurements keeping exposure to less than 5 minutes. Magneto-resistance and the Hall resistance measurements were carried out using pressed indium leads in van der Pauw geometry in a liquid He cryogenic system with a base temperature of 1.5 K and in the perpendicular magnetic field (B) up to ±9 Tesla. $R_{12,43}$ ($R_{XX}$), $R_{14,23}$ ($R_{YY}$) and $R_{13,24}$ ($R_{XY}$) were measured using KE2400 sourcemeter and KE7001 switch matrix system, where ij are the current leads and kl are the voltage leads in Rij,kl. $R_{XX}$ and $R_{YY}$ measure longitudinal resistance, while $R_{XY}$ measures Hall resistance. The data was symmetrized with respect to B to eliminate unwanted mixing of the longitudinal and Hall components. From symmetrized $R_{XX}$ and $R_{YY}$, average longitudinal resistance ($R_{AVG}$) was extracted. The sheet carrier density was calculated from $R_{XY}$ using the Hall formula:

$$n_{sheet} = (e\, dR_{xy}/dB)^{-1}$$

where $dR_{XY}/dB$ was taken from the linear part of $R_{XY}$ for |B|≤0.5 T and e is the electronic charge. The carrier mobility (μ) was then calculated using μ=(e $R_{sheet}$ $n_{sheet}$)$^{-1}$, where $R_{sheet}=R_{AVG}$ (0)π/ln(2) is the zero field sheet resistance.

For ARPES and STM measurements, the films were capped by a 100 nm selenium over-layer. For STM measurement, ion-milling was performed to remove a few nanometers of ambient contaminated selenium layer followed by annealing to ~200° C. to evaporate rest of selenium in the STM chamber. STM measurements were carried out at 78 K using Omicron LT-STM with a base pressure of $1\times10^{-11}$ Torr. For ARPES measurement, the selenium over-layer was removed by heating the films to ~250° C. in the ARPES chamber. ARPES measurements were then performed at room temperature using a 7 eV photon energy LASER source and a SPECS Phoibos 225 hemispherical electron analyzer.

TEM samples were prepared by focused ion beam with final Ge ion energy of 5 keV. A JEOL ARM 200CF equipped with a cold field-emission gun and double spherical-aberration correctors operated at 200 kV were used for HAADF-STEM image acquisition with a range of detection angles from 68 to 280 mrad.

TDMTS measurements were performed in transmission geometry using a home-built THz detector.

For QHE measurement, an 8 QL thick $Bi_2Se_3$ film on BIS-BL was grown on 5 mm×5 mm $Al_2O_3(0001)$ substrate and in situ capped by both 50 nm $MoO_3$ and 50 nm Se to prevent environmental contamination during transportation to the National High Magnetic Field Lab in Florida. The film was then hand-patterned into a Hall-bar just before measurement using a metal mask and a pair of tweezers. Hall and longitudinal resistances were measured using a Keithley 2400 source meter combined with a Keithley 7001 switch matrix in six-terminal geometry.

II. Evaporation of $Bi_2Se_3$ Through $In_2Se_3$ after 600° C. Annealing During BIS-BL Growth In order to study the effect of annealing $Bi_2Se_3$—$In_2Se_3$ hetero-structure during BIS-BL growth, a 50 QL $Bi_2Se_3$—10 QL $In_2Se_3$ hetero-structure film was grown on $Al_2O_3$ and annealed it to 600° C. The sample was then analyzed using Rutherford backscattering spectroscopy (RBS), which is a quantitative tool to study thickness and composition of thin films. From the total number of each species and known values of the atomic areal number density, the film was composed of ~10 QL $(Bi_{0.02}In_{0.98})_2Se_3$ with 1% error bar in composition. This indicates that the 50 QL $Bi_2Se_3$ layer evaporated away almost entirely leaving behind an intact $In_2Se_3$ layer. This independently confirms the results from HAADF-STEM results in FIG. 1b that shows that during the BIS-BL growth, the conducting 3 QL $Bi_2Se_3$ seed layer evaporates almost completely through the 20 QL $In_2Se_3$ layer after 600° C. annealing, thus making the BIS-BL fully insulating.

III. Nonlinear Hall Effect and Two-Carrier Model Fitting

The non-linearity in the Hall Effect was observed at fields higher than ~0.5 T for all films, which usually indicates multiple conduction channels with different mobilities. Except for 5 QL thick film, which shows weak non-linearity, all the other films show pronounced non-linearity similar to 25 and 60 QL thick films. For the non-linear Hall effect, the sheet carrier density calculated from low field Hall slope gives a mobility-weighted-average of different carrier species rather than carrier density of any single species. In order to specify sheet carrier density and mobility of individual species the two-carrier model (equation (S1)) was used to fit Hall Effect data:

$$R_{Hall}(B) = -\frac{B}{e}\left[\frac{(n_1\mu_1^2 + n_2\mu_2^2) + B^2\mu_1^2\mu_2^2(n_1+n_2)}{(n_1\mu_1 + n_2\mu_2)^2 + B^2\mu_1^2\mu_2^2(n_1+n_2)^2}\right] \quad (S1)$$

where $R_{Hall}(B)$ is the Hall resistance, B is the applied magnetic field, e is the electronic charge, and $n_i$ and $\mu_i$ are the sheet carrier density and mobility, respectively, of $i^{th}$ species with i=1, 2. $n_i$ and $\mu_i$ are the fitting parameters. Experimentally, there are only two independent parameters: $R_{Hall}(0)/B$ was fixed to the low field slope of the Hall effect, where locally $R_{Hall}$ was linear. The zero field sheet resistance $(R_{sheet})=1/[e(n_1\mu_1+n_2/\mu_2)]$ was used to provide an additional constraint to the fitting. This reduces the number of independent fitting parameters to just two.

IV. ARPES and Estimate of in Diffusion from STM

One important issue during the growth of $Bi_2Se_3$ on BIS-BL is the possibility of indium diffusion into the $Bi_2Se_3$ film. It is known that there can be inter-diffusion between indium and bismuth in $Bi_2Se_3$ and $In_2Se_3$ heterostructures, and the solid solution of $(Bi_{1-x}In_x)_2Se_3$ goes through a topological phase transition at x≈0.03-0.07, becoming a band insulator for x>0.25. The choice of $(Bi_{0.5}In_{0.5})_2Se_3$, rather than $In_2Se_3$, as the topmost layer of BIS-BL, helps to minimize indium diffusion into $Bi_2Se_3$ and maintain its non-trivial topology. The TI nature of $Bi_2Se_3$ films grown on BIS-BL even in ultrathin regime is shown by observation of gapped TSS for a 5 QL thick $Bi_2Se_3$. Such gapped TSS have been observed in ultra-thin $Bi_2Se_3$ grown on 6H—SiC (0001) with the gap attributed to hybridization of the top and bottom TSS. This is direct evidence of non-trivial nature of $Bi_2Se_3$ grown on top of BIS-BL even in the ultrathin limit. Such an observation means that the In diffusion should be much less than ~3%, where a signature of the topological phase transition starts to appear.

V. Consistency of Transport Data and ARPES with TSS Conduction

From Hall measurement, it is clear that low field sheet carrier density ($n_{low}$) is less than ~$2\times10^{12}$ cm$^{-2}$ in the entire thickness range. Two-carrier fitting from the Hall effect measurement gives a total sheet carrier density ($n_{tot}=n_1+n_2$) to be at most ~$5\times10^{12}$ cm$^{-2}$. In $Bi_2Se_3$, when the total sheet carrier density is ~$1\times10^{13}$ cm$^{-2}$ (or equivalently ~$5\times10^{12}$ cm$^{-2}$ per surface) the surface Fermi energy lies at the bottom of the bulk conduction band.

Given that the total carrier density $n_1+n_2$ is much smaller than ~$1\times10^{13}$ cm$^{-2}$ for films grown on BIS-BL, they should have, if anything, upward band bending resulting in the formation of a depletion region. Such upward band bending cannot form quantum well states or 2DEG. Therefore, the most consistent interpretation of the observed channels with thickness independent sheet carrier density is that both of them originate from the TSS. This is also supported by ARPES data, where the surface $E_F$ lies in the bulk band gap, and no such 2DEGs are observed. In contrast, ARPES measurements on $Bi_2Se_3$ grown directly on $Al_2O_3$ clearly show the presence of such 2DEG states. In order to show the existence of a 2DEG state is unlikely to be present, the expected sheet carrier density of TSS if either $n_1$ or $n_2$ originates from 2DEGs can be estimated. Let us assume that $n_1 \approx 1.8\times10^{12}$ cm$^{-2}$ is due to 2DEG carriers. The Fermi wave-vector for 2DEG using $k_{F,2DEG}=\sqrt{2\pi n_1}$ is obtained. This results in $k_{F,2DEG}=0.034$ Å. Using the ARPES spectrum of $Bi_2Se_3$ grown on $Al_2O_3$, the Fermi wave-vector of corresponding TSS ($k_{F,TSS}$) at this $k_{F,2DEG}$ can be extrapolated, which yields $k_{F,TSS} \approx 0.088$ Å. From $k_{F,TSS}$, $n_{sheet,TSS}=k_{F,TSS}^2/4\pi \approx 6.1\times10^{12}$ cm$^{-2}$ for corresponding TSS is calculated, where the 4 in the denominator is due to the non-degenerate nature of TSS. Similar estimation assuming $n_2 \approx 3\times10^{12}$ cm$^{-2}$ to come from 2DEG yields $n_{sheet,TSS} \approx 6.8\times10^{12}$ cm$^{-2}$. This gives a combined TSS and 2DEG sheet carrier density of ~$7.9\times10^{12}$ cm$^{-2}$ (~$9.8\times10^{12}$ cm$^{-2}$) from a single surface assuming $n_1$ ($n_2$) originates from 2DEG state. For simplicity if the other surface is assumed to have similar carrier density, then the total carrier density would be well above ~$10^{13}$ cm$^{-2}$, which is over three times that of what is observed from Hall effect which rules out the presence of 2DEGs. Therefore, it is most natural to associate the two channels to the TSSs from the top and bottom surfaces, respectively. Naturally, the following question arises: which of the two TSSs is responsible for the higher mobility channel? This can be indirectly answered from the capping layer samples. Considering that the mobilities of the Se and $MoO_3$ capped films are substantially reduced from uncapped samples, it seems that the higher mobility channel originates from the top TSS; if the high mobility channel originated from the bottom TSS, such dramatic reduction would not be expected with capping.

The Fermi level ($E_F$) obtained from Hall effect is compared to that obtained from ARPES on 30 QL $Bi_2Se_3$ grown on BIS-BL. From ARPES, $E_F$ is observed to be ~0.17 eV above the Dirac point, and the Fermi wave-vector ($k_F$) is observed to be ~0.052 Å$^{-1}$. In order to obtain $E_F$ from the Hall effect, $k_{F,Hall}$ can be calculated from $k_{F,Hall}=\sqrt{4\pi n_1}$, wherein $n_1$ is obtained from a two-carrier fit of Hall Effect measurement, and the pre-factor 4 is due to spin non-degenerate nature of TSS. Since $n_1$ is ~1.8×10$^{12}$ cm$^{-2}$ for the entire thickness range, this gives $k_{F,Hall}$ to be ~0.0475 Å$^{-1}$.

VI. SdH Oscillation Vs. Cyclotron Resonance

Cyclotron mass can be obtained from Shubnikov-de Haas oscillations in magnetoresistance measurement or from cyclotron resonance in magneto-optical measurement. Despite significantly enhanced Hall mobilities, no Shubnikov-de Haas (SdH) oscillations were observed in fields up to 9 Tesla. This is surprising considering that the standard Bi$_2$Se$_3$ or even Cu-doped Bi$_2$Se$_3$ films, having much lower mobilities exhibit well developed SdH oscillations in fields higher than ~5 T. Although the origin for the absence of SdH oscillations in these high mobility films is not fully understood yet, one possibility is due to the carrier density inhomogeneity that may be more severe in these low carrier density samples. As previously pointed out in conventional two dimensional electron gas system of similar sheet carrier densities in GaN/AlGaN heterostructures any slight inhomogeneities in the carrier density can significantly suppress the SdH oscillation due to the phase cancelling effect: this view is further supported by the very observation of the full quantum Hall effect when all carriers are driven to the lowest Landau level, where the effect of any inhomogeneity in carrier densities vanishes. In contrast, well-developed cyclotron resonance was observed in time domain magneto-terahertz spectroscopy measurement, from which cyclotron mass was extracted.

VII. Time Domain Magneto-Terahertz Spectroscopy Measurement and Fits

In order to measure the complex Faraday rotation (FR), phase modulation technique was used to measure the polarization states accurately which allows measurement of $E_{xx}(t)$ and $E_{xy}(t)$ simultaneously in a single scan. Faraday rotation can be obtained by $\theta_F=\arctan(E_{xy}(\omega)/E_{xx}(\omega))=\theta_F'+i\theta_F''$ after Fourier transforming into the frequency domain. Sapphire has no detectable FR and 20 nm Se or 50 nm MoO$_3$ do not show rotation within our experimental accuracy (0.5 mrad). The non-smooth background from a reference substrate was subtracted before fitting the data.

The data were fitted by a Drude-Lorentz model with a Drude term, a phonon term and a term for the background dielectric constant ($\in_\infty$) coming from higher energy absorptions. The formula for conductance in magnetic field is $$G_\pm = -i\epsilon_0\omega d\left[\frac{\omega_{pD}^2}{-\omega^2-i\Gamma_D\omega \mp \omega_c\omega} + \frac{\omega_{pDL}^2}{\omega_{DL}^2-\omega^2-i\Gamma_{DL}\omega \mp \omega_{cDL}\omega} + \epsilon_\infty - 1\right]$$

where $\omega_p$ represents the plasma frequencies, F represents scattering rates, d is the film thickness, and the ±sign denotes the response to right/left circularly polarized light respectively. The parameters of the phonon and the high-frequency terms were constrained by those extracted from zero-field conductance value (as explained below) and only allowed the cyclotron frequency ($\omega_n$) and the scattering rate to vary. From $G_\pm$, the complex transmission was calculated for right and left circularly polarized light $t_\pm$. Then the complex FR was calculated by $\tan(\theta_F)=-i(t_+-t_-)/(t_++t_-)$. From the fits the cyclotron frequency, $\omega_c$, was extracted for the Drude component from which the cyclotron mass (m*) is calculated using $\omega_c=eB/(2\pi m^*)$. Similarly, the zero field real conductance spectra was fitted by an oscillator model with a Drude term describing free electron-like motion, a Drude-Lorentz term modeling the phonon and a lattice polarizability ($\in_\infty$) term that originates from absorptions outside the spectral range.

$$G(\omega) = \left[-\frac{\omega_{pD}^2}{i\omega-\Gamma_D} - \frac{i\omega\omega_{pDL}^2}{\omega_{DL}^2-\omega^2-i\omega\Gamma_{DL}} - i(\epsilon_\infty-1)\right]\epsilon_o d$$

$\omega_{pD}$, $\omega_p$DL $\Gamma_{DL}$, and $\in_\infty$ obtained from this fit were used to constrain the fit at finite magnetic field.

These and other advantages of the present disclosure will be apparent to those skilled in the art from the foregoing specification. Accordingly, it will be recognized by those skilled in the art that changes or modifications may be made to the above-described embodiments without departing from the broad inventive concepts of the disclosure. It should, therefore, be understood that this disclosure is not limited to the particular embodiments described herein, but is intended to include all changes and modifications that are within the scope and spirit of the disclosure as defined in the claims.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present solution may be embodied in other specific forms without departing from its spirit or essential characteristics. The described embodiments are to be considered in all respects only as illustrative and not restrictive. The scope of the present solution is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present solution should be or are in any single embodiment of the invention. Rather, language referring to the features and advantages is understood to mean that a specific feature, advantage, or characteristic described in connection with an embodiment is included in at least one embodiment of the present solution. Thus, discussions of the features and advantages, and similar language, throughout the specification may, but do not necessarily, refer to the same embodiment.

Furthermore, the described features, advantages and characteristics of the present solution may be combined in any suitable manner in one or more embodiments. One skilled in the relevant art will recognize, in light of the description herein, that the present solution can be practiced without one or more of the specific features or advantages of a particular embodiment. In other instances, additional features and advantages may be recognized in certain embodiments that may not be present in all embodiments of the present solution.

Reference throughout this specification to "one embodiment", "an embodiment", or similar language means that a particular feature, structure, or characteristic described in connection with the indicated embodiment is included in at least one embodiment of the present solution. Thus, the phrases "in one embodiment", "in an embodiment", and similar language throughout this specification may, but do not necessarily, all refer to the same embodiment.

As used in this document, the singular form "a," "an," and "the" include plural references unless the context clearly dictates otherwise. Unless defined otherwise, all technical and scientific terms used herein have the same meanings as commonly understood by one of ordinary skill in the art. As used in this document, the term "comprising" means "including, but not limited to."

The term "(s)" following a noun contemplates the singular or plural form, or both.

The term "and/or" means any one of the items, any combination of the items, or all of the items with which this term is associated.

The phrases "in one embodiment," "in various embodiments," "in some embodiments," and the like are used repeatedly. Such phrases do not necessarily refer to the same embodiment, but they may unless the context dictates otherwise.

The terms "comprising," "having," and "including" are synonymous, unless the context dictates otherwise.

The features and functions disclosed above, as well as alternatives, may be combined into many other different systems or applications. Various presently unforeseen or unanticipated alternatives, modifications, variations or improvements may be made by those skilled in the art, each of which is also intended to be encompassed by the disclosed embodiments.

What is claimed is:

1. A method of making a high quality single crystalline $In_2Se_3$ layer, comprising:

depositing at least one quintuple layer (QL) of $Bi_2Se_3$ on a substrate layer at a temperature below which only the Se adheres to the substrate;

depositing a plurality of $In_2Se_3$ QL's on the deposited $Bi_2Se_3$ layer or layers at a temperature between about 200° C. and about 330° C. to form a hetero-structure;

heating the hetero-structure to a temperature between about 400° C. and about 700° C. so that the $Bi_2Se_3$ layer is diffused through the $In_2Se_3$ layer and evaporated away.

2. The method of claim 1, wherein said $Bi_2Se_3$ is deposited at a temperature between about 110° C. and about 200° C.

3. The method of claim 1, wherein said hetero-structure is heated to about 600° C. so that the $Bi_2Se_3$ layer is diffused through the $In_2Se_3$ layer and evaporated away.

4. The method of claim 1, wherein said substrate is single crystal $Al_2O_3$ or a high κ-dielectric $SrTiO_3$ (111).

5. The method of claim 1, wherein a plurality of $Bi_2Se_3$ QL's are deposited on said substrate.

6. The method of claim 1, wherein least one QL of $BiInSe_3$ is deposited on said $In_2Se_3$ layer, after which at least one QL of $Bi_2Se_3$ is deposited on said $BiInSe_3$ layer at the same temperature that $BiInSe_3$ is grown on $In_2Se_3$.

7. The method of claim 1, further comprising the step of depositing at least one QL of $Bi_2Se_3$ on said $In_2Se_3$ layer at a temperature between about 200° C. and about 300° C.

8. The method of claim 6, wherein said $Bi_2Se_3$ layer and said $BiInSe_3$ layer are deposited at a temperature between about 200° C. and about 300° C.

9. The method of claim 1, further comprising the step of depositing a capping layer $MoO_3$ on said $Bi_2Se_3$ layer.

10. The method of claim 9, further comprising depositing an Se layer on top of said $MoO_3$ layer.

* * * * *

UNITED STATES PATENT AND TRADEMARK OFFICE
CERTIFICATE OF CORRECTION

PATENT NO. : 10,633,763 B2
APPLICATION NO. : 15/819477
DATED : April 28, 2020
INVENTOR(S) : Seongshik Oh et al.

It is certified that error appears in the above-identified patent and that said Letters Patent is hereby corrected as shown below:

In the Specification

At Column 1, Line number 14, enter the following:
STATEMENT REGARDING FEDERALLY SPONSORED RESEARCH
This invention was made with government support under grant number DMR1308142 awarded by the National Science Foundation and grant number N00014-12-1-0456 awarded by the United States Office of Naval Research. The government has certain rights in the invention.

Signed and Sealed this
Sixteenth Day of April, 2024

Katherine Kelly Vidal
*Director of the United States Patent and Trademark Office*